United States Patent [19]

Taylor

[11] Patent Number: 4,874,063
[45] Date of Patent: Oct. 17, 1989

[54] PORTABLE ELEVATOR TRAFFIC PATTERN MONITORING SYSTEM

[75] Inventor: Kenneth D. Taylor, South Windsor, Conn.

[73] Assignee: Otis Elevator Company, Farmington, Conn.

[21] Appl. No.: 263,676

[22] Filed: Oct. 27, 1988

[51] Int. Cl.$^4$ .............................................. B66B 3/00
[52] U.S. Cl. ................................... 187/130; 187/131; 187/134
[58] Field of Search ............... 187/101, 124, 130, 131, 187/132, 134, 135, 136

[56] References Cited

U.S. PATENT DOCUMENTS

| | | | |
|---|---|---|---|
| 2,074,835 | 3/1937 | Fitzgerald | 187/134 |
| 3,176,797 | 4/1965 | Dinning | 187/131 |
| 3,428,815 | 2/1969 | Thompson | 187/134 X |
| 4,044,860 | 8/1977 | Kaneko et al. | 187/132 |
| 4,672,531 | 6/1987 | Uetani | 187/124 X |
| 4,677,577 | 6/1987 | Takabe et al. | 187/124 X |
| 4,800,386 | 1/1989 | Kulju et al. | 187/131 X |

FOREIGN PATENT DOCUMENTS

| | | | |
|---|---|---|---|
| 618754 | 9/1935 | Fed. Rep. of Germany | 187/134 |
| 2115578 | 9/1983 | United Kingdom | 187/130 |

*Primary Examiner*—William M. Shoop, Jr.
*Assistant Examiner*—W. E. Duncanson, Jr.
*Attorney, Agent, or Firm*—Francis J. Maguire, Jr.

[57] ABSTRACT

A plurality of components are mounted within a portable housing which may be mounted inside an elevator car on top of the door frame. The components comprise a people sensing means for detecting individual persons entering and leaving the elevator car and providing signals indicative of each such person and the direction of movement, and further comprise height sensing means for providing a signal indicative of the altitude of the portable housing, a clock for providing a time signal indicative of the time of day and a signal processor responsive to the person signal, the floor signal and the time signal for storing the time of day of a particular stop, the number of people entering and leaving and the floor.

4 Claims, 7 Drawing Sheets

PERSON ENTERING   PERSON LEAVING

PORTABLE ELEVATOR TRAFFIC PATTERN MONITORING SYSTEM

TECHNICAL FIELD

The present invention relates generally to elevators and, more particularly, to passenger counting.

BACKGROUND ART

It is known in the art of elevators to monitor the number of people entering and leaving elevators for a short period, e.g., during the course of a typical day and to use such information to create more effective dispatching strategies or to plan for modernization projects.

In contrast to various automatic control devices usually intended for permanent installation, the most widespread and effective method utilized in the prior art for short term passenger tracking has been to station a person in each car to record the movement of people in terms of numbers, time and floor by hand. This is a laborious process which tends to be error prone. Motion sickness can also become a problem after a period of monitoring, requiring a sizeable number of relief personnel. It would thus be advantageous to have an accurate portable device to perform this function.

As suggested, there are already known various arrangements for automatically detecting penetration of humans into or movement through a controlled region. Such detecting arrangements are being used, for example, to defend a perimeter of an installation, to monitor movement of personnel within an installation, to detect the presence of people on premises or the like.

Various arrangements of detectors and recordal devices have been tried for various purposes but these suffer from inaccuracies. So, for instance, U.S. Pat. No. 3,207,266 discloses an elevator passenger counting and totalizing device in which a pair of preferably infrared horizontal beams traverse the entranceway of an elevator car which when interrupted actuate suitable circuitry to give an indication of a number of people entering and leaving the car.

Also, for instance, U.S. Pat. No. 4,263,585 discloses an intrusion detection system in which a multi-segment mirror focuses thermal radiation emanating from a moving person onto a thermopile detector in such a manner that each mirror segment separately directs the radiation in succession to detector elements, whereby the direction of movement of such a person can be determined.

Another device responsive to infrared radiation is disclosed in U.S. Pat. No. 4,346,427, wherein an infrared sensor is being used to detect any movement of a person into or within the region under surveillance The output signal of this sensor is utilized for controlling the operation of lights, air conditioning or the like for the affected region. A control device of this type is also disclosed in the published international patent application No. PCT/US81/01769 (International Publication No. WO82/02270). Moreover, a passive infrared occupancy detector of a similar type has been developed by Tishman Research Co. and United Technologies Corporation and is commercially available under the designation Infracon Model 628.

U.S. Pat. No. 4,023,135 to Hanmura et al discloses an ultrasonic device, using pulse echo techniques, for counting people as they enter the lobby or car.

Two optical systems which scan the perimeter of an area are covered in U.S. Pat. Nos. 4,127,766 (to Thayer) and 4,303,851 (to Mottier). Thayer teaches using an array of discrete optical sensors whereas Mottier teaches using a line scan camera.

Other systems have used microwave doppler radar for passenger counting purposes. See U.S. Pat. No. 4,317,117 (to Chasek) and G.B. Patent No. 2072987.

Monitoring hall calls, load sensing and floor mats have also been used for passenger counting purposes. See U.S. Pat. Nos. 4,458,788 (Traffic Analysis Apparatus for Lift System, to Lepore), 4,492,288 (Group Control for Elevators Containing an Apparatus for Controlling the Down-Peak Traffic, to Schroder), 4,299,309 (Empty Elevator Car Determination, to Bittar et al), and 3,543,883 (Floor Mat Passenger Counter, to Kozera).

From another approach, various attempts have already been made to develop techniques for measuring or estimating the elevator load, such as weight-measuring sensors mounted on the elevator. Thus, a system for measuring interfloor traffic for group control of elevator cars is disclosed by Yoneda in U.S. Pat. No. 4,536,842 where the number of incoming and outgoing passengers at an elevator floor is determined by detecting a change in weight of the elevator car assuming that one passenger weighs 55 to 60 kg. However, since equipment of this type is sensitive only to the total weight of the elevator occupants and not to their number, this equipment is not capable of distinguishing between the presence in the elevator of, say, on the one hand, one elevator user who is rather heavy, and on the other hand, two or three elevator users who are individually much lighter. Thus, this equipment does not provide reliable information about the actual number of elevator occupants or about the actual number of people entering or leaving the elevator at the particular floors.

As advantageous as the above devices may be for the purposes for which they have been developed, they are actually not as well suited as might be desired for accurately determining the number of people passing through the region under surveillance, such as an elevator doorway, and the direction of passage of such people through the surveillance region.

Furthermore, in general, these approaches are not suitable for short term monitoring of elevator passenger traffic for a variety of reasons. The microwave, optical and ultrasonic techniques are either difficult to temporarily install in an elevator car or would not be sufficiently precise to accurately (i.e., less than 5% error) count passengers. Techniques using hall calls or load sensing require interconnection with the elevator controller which is not always practicable.

As discussed above, in many instances, it would be desirable to possess accurate information so as to be able to use it for various purposes, such as for determining the number of people present in an elevator in order to estimate the elevator load, for determining the number of people entering and leaving an elevator at any of the various floors of a building to determine the traffic flow pattern in the building for use in elevator dispatching, or the like.

As also discussed previously above, heretofore in the art, accurate collection devices have not been made. The lack of accuracy of the information and the cost of gathering this information outweigh any benefits derived therefrom. Thus, the prior art approaches leave much to be desired, especially as far as the accuracy or veracity of the information gathered.

While it will be desirable for some applications to use an accurate counting scheme as a permanent part of the control apparatus for an elevator or other installation, it will also be advantageous to be able to simply and independently monitor an installation for a relatively short period of time such as a day in order gather the information and use it, for example, to modify an elevator dispatching control strategy or to plan for modernization projects.

DISCLOSURE OF THE INVENTION

The object of the present invention is to provide a portable elevator traffic monitor According to the present invention, a plurality of components are mounted within a portable housing for installation inside an elevator car above the door frame. The components comprise people sensing means, responsive to the presence of one or more persons, for providing a person signal indicative of the fact that a person has moved in or out of the elevator and also indicative of the direction of the movement of the person, a height sensor, responsive to the altitude of the portable housing for providing a floor signal corresponding to the floor at which the elevator car is located at any given time, a clock for providing a time signal indicative of the time of day, and a signal processor, responsive to the person signal, the floor signal and the time signal for storing the person, floor and time signals.

In further accord with the present invention, the plurality of components may further comprise a battery for providing power for the signal processing means and any other components within the portable unit requiring DC power.

In still further accord with the present invention, the plurality of components may further comprise a door open sensor, responsive to the position of the elevator car door, for providing a door signal indicative of the door's position and wherein the signal processing means is responsive to the door signal for carrying out the storing of the person, floor and time signals in response to the door signal.

In still further accord with the present invention, the plurality of components may further comprise a ground floor sensor, responsive to a selected position of the elevator car, for providing a ground floor signal and wherein the signal processing means is responsive to the ground floor signal for providing a zeroing signal and wherein the height sensing means is responsive to the zeroing signal for providing the floor signal with a magnitude indicative of the selected position.

Currently, traffic pattern data are acquired using a labor-intensive manual technique. Using people-sensing techniques to be disclosed in detail below, an automated system for acquiring traffic data is disclosed herein. The system is inconspicuous to the passenger, is easily attached to the elevator car, and does not require connection to the elevator controller.

The present invention contributes to the art by providing an automated method of counting and recording the number of people entering and exiting an elevator. Although the prior art discloses a number of methods of sensing or counting people, none of these techniques have employed concurrent people-sensing and current floor sensing Further, the present invention teaches the combined concept of people-sensing and floor sensing with an easily accessible method of recording and storing such data.

Another contribution to the art is that the disclosed device does not require connection to the elevator car electronics, to the elevator controller, or to the elevator power in order to operate. This has a number of distinct advantages from an operational standpoint. First, access to the top of the car is not required since AC power is not used. Consequently, elevator service personnel are not required in order to install the device. This facilitates installation by non-technical personnel. Second, since no connections are made to the elevator mechanism other than mechanical attachment to the car, potential interference with elevator performance is avoided Third, since the device is a one-package system, installation is both easy and quick, minimizing elevator downtime. And, finally, the portable device disclosed herein may be used on the elevators of any manufacturer. In general, any of the people counting/sensing techniques previously disclosed in the prior art would require access to the elevator controller for either people count or current floor data.

The inconspicuous nature of the device is an advantage. The device does not require that the passengers step on or contact the device in any fashion or perform any task not ordinarily associated with elevator use, which is not the case for the hall car or floor mat people counters. Further, there is no visible radiation or wires which might get the attention of passengers.

These and other objects, features and advantages of the present invention will become more apparent in light of the following detailed description of a best mode embodiment thereof, as illustrated in the accompanying drawing.

BEST MODE FOR CARRYING OUT THE INVENTION

Figure 1:
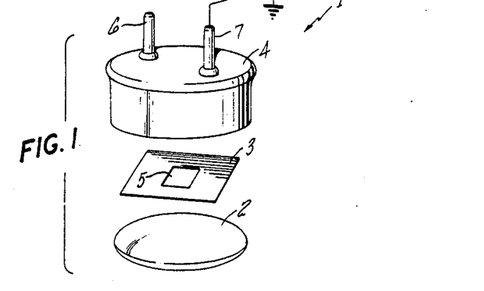
FIG. 1 is an exploded simplified perspective view of a pyroelectric detecting arrangement which may be utilized in carrying out the present invention.

Referring now to the drawing in detail, and first to FIG. 1 thereof, it may be seen that the reference numeral 1 has been used therein to identify a pyroelectric detector arrangement which may be utilized in carrying out the objects of present invention. The pyroelectric detector arrangement 1 includes as its main components a lens 2, a mask 3, and a pyroelectric detector or sensor 4.

The lens 2 concentrates electromagnetic radiation from the region to be surveilled, especially that in the infrared range of the spectrum, onto the pyroelectric detector 4. The lens 2, together with a non-illustrated housing supporting the components 2, 3 and 4, also prevents convection heat from reaching the detector 4. It is advantageous when the lens 2 is made of, or is coated with, a material which prevents radiation outside the spectral range of interest from reaching the detector 4, so that such unwanted radiation will not adversely affect the accuracy of measurement of the detector 4. The lens 2 has a relatively short focal length so as to concentrate the radiation from the surveillance region within a relatively short distance onto an active area of the detector 4.

The mask 3, which is shown to be interposed between the lens 2 and the detector 4, but which may be situated instead at any other location, such as in front of the lens 2 as considered in the direction of propagation of the radiation to be detected from the region under surveillance to the detector 4, or constitute a part of the lens 2 by being directly applied or connected thereto, determines the outer boundary of the region under surveillance by masking out radiation from outside the surveillance region. Obviously, the mask 3 is so situated relative to the components 2 and 4 of the arrangement 1 and has such properties that it permits the radiation of interest from all of the surveillance region to reach the active area of the detector 4, while simultaneously preventing all such radiation radiation of interest and other radiation stemming from regions external to the surveillance region from propagating toward the active area of the detector 4. As shown in FIG. 1, the mask 3 may have a single, substantially centrally located, rectangular aperture 5 through which the radiation from the surveillance region passes on its way to the detector 4.

The detector 4 may be of any known type sensitive to changes in the amount of infrared radiation reaching the same, but preferably is of a pyroelectric type, such as that available from the Plessey Company under the designation 5L5215. This pyroelectric detector already incorporates a germanium filter window which prevents passage of the undesired radiation therethrough, so that it is not necessary for the lens 2 to perform this filtering function.

Figure 2:
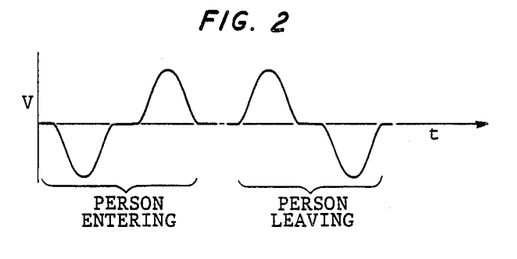
FIG. 2 is a diagram representing the changes in an analog electrical signal generated in the detecting arrangement of FIG. 1 in response to entry of a person into a surveillance region and to departure of a person from the surveillance region.

As shown at the left-hand portion of FIG. 2 of the drawing, the pyroelectric detector 4 of the above type generates an electrical signal which first has a negative excursion from its initial value, followed by return to the initial value, a positive excursion, and final return to the initial value when a person enters the surveillance region, adding thermal energy to the scene. On the other hand, when a person leaves the surveillance region, with attendant reduction in the total thermal energy emanating from the surveillance region, the electrical signal issued by the pyroelectric detector 4 first has a positive excursion from its initial value, followed by return to the initial value, a negative excursion, and final return to the initial value. Thus, the sequence in which the negative and positive excursions occur indicates whether a person has entered or left the surveillance region. The pyroelectric detector 4 differentiates (with respect to time) the total optical power striking its active area, with only changes in the level of the optical power producing an output. This, of course, presupposes that the combined effect of the emissivity and the temperature of the person adds energy to the scene, but it would be rare indeed that this condition would not be satisfied.

The thus modulated electrical signal then appears at one terminal 6 of the detector 4, while another terminal 7 of the detector 4 is connected to the ground. This modulated electrical signal is then evaluated by an evaluating circuitry, such as the evaluating circuit 8 illustrated in FIG. 3 of the drawing.

Figure 3:
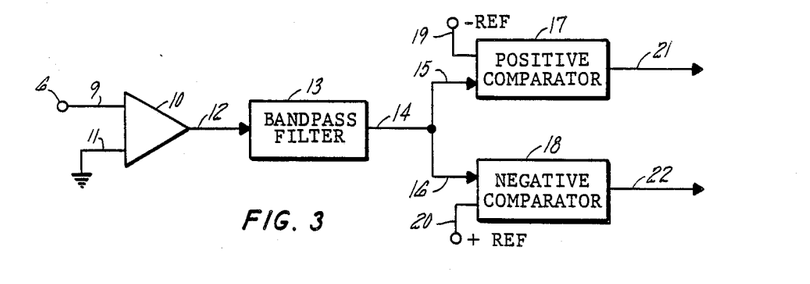
FIG. 3 is a block diagram depicting an evaluation circuitry which may be used for evaluating the signals received from the detecting arrangement of FIG. 1.

The terminal 6 of the detector 4 is connected to one input 9 of an amplifier 10 of a known construction, while another input 11 of the amplifier 10 is grounded. An amplified version of the above electrical signal appears at an output 12 of the amplifier 10 and is supplied to an input of a bandpass filter 13 of a known construction. However, it will be appreciated that, when the detector 4 already incorporates an amplifier, the amplifier 10 may be omitted and the terminal 6 of the detector 4 is then directly connected to the input of the bandpass filter 13. The bandpass filter 13 filters out undesired frequencies from the amplified electrical signal, presenting a filtered electrical signal at its output 14.

In the construction illustrated in FIG. 3 of the drawing, the filtered electrical signal is then supplied from the output 14 of the bandpass filter 13 to respective first inputs 15 and 16 of positive and negative comparators 17 and 18 which also have well-known constructions. These comparators 17 and 18 have respective second inputs 19 and 20. The second input 19 of the positive comparator 17 has a negative reference voltage −REF supplied thereto, whereas a positive reference voltage +REF is supplied to the second input 20 of the negative comparator 18. The comparators 17 and 18 compare the signals appearing at the respective inputs 15 and 19, or 16 and 20, thereof, and issue respective binary signals at their respective outputs 21 and 22, depending on the results of the respective comparisons.

It is currently preferred for the comparators 17 and 18 to be of such a type that the effective output voltage of the positive comparator 17 will abruptly change upon entry of a person into the surveillance region during the initial negative excursion of the electrical output signal of the detector 4 when the
voltage surpasses the reference voltage −REF with attendant change in the binary value of the output signal of the positive comparator 17, to abruptly return to its initial binary value during the return of the electrical output signal of the detector 4 to zero upon crossing the reference voltage −REF in the opposite sense, to remain at such initial binary value during the positive excursion of the electrical output signal of the detector 4, and will remain at its initial binary value when a person leaves the surveillance region during the initial excursion of the electrical output signal of the detector 4 in the positive sense and thus away from the reference voltage −REF, to abruptly change its binary value during the subsequent negative excursion of the electrical output signal of the detector 4 on passage of this electrical output signal through the reference voltage −REF and to maintain this other binary value for so long as the electrical output signal of the detector 4 remains beyond the reference value -REF with subsequent return to the initial binary value. Thus, it may be seen that the output signal of the positive comparator 17 will change its binary value earlier when a person enters the surveillance region than when a person leaves the surveillance region, as measured from the commencement of the respective initial excursion in the electrical output signal of the detector 4.

On the other hand, the effective output voltage of the negative comparator 18 will abruptly change when a person leaves the surveillance region during the initial positive excursion of the electrical output signal of the detector 4 as the input voltage surpasses the reference voltage +REF with attendant change in the binary value of the output signal of the negative comparator 18, to abruptly return to its initial binary value during the return of the electrical output signal of the detector 4 to zero upon crossing the reference voltage +REF in the opposite sense, to remain at such initial binary value during the negative excursion of the electrical output signal of the detector 4, and will remain at its initial binary value when a person enters the surveillance region during the initial excursion of the electrical output signal of the detector 4 in the negative sense and thus away from the reference voltage +REF, to abruptly change its binary value during the subsequent positive excursion of the electrical output signal of the detector 4 on passage of this electrical output signal through the reference voltage +REF and to maintain this other binary value for so long as the electrical output signal of the detector 4 remains beyond the reference value +REF with subsequent return to the initial binary value. As a consequence, the output signal of the negative comparator 18 will change its binary value earlier when a person leaves the surveillance region than when a person enters the surveillance region, as measured from the commencement of the respective initial excursion in the electrical output signal of the detector 4.

Thus, it may be seen that the binary value of the output signal of each of the comparators 17 and 18 will change in response to any change of sufficient magnitude in the total thermal radiation energy reaching the detector 4, whether such thermal radiation energy change is due to a person's entering or to a person's leaving the surveillance region. However, the time relationship between the changed binary values of the output signals of the comparators 17 and 18 will be different. More particularly, when a person enters the surveillance region, the binary value of the positive comparator 17 will change in advance of that of the negative comparator 18 and, when a person leaves the surveillance region, the binary value of the negative comparator 18 will change in advance of that of the positive comparator 17. In other words, the changed binary output values of the comparators 17 and 18 will be in one lead/lag relationship when a person enters, and in the opposite lead/lag relationship when a person leaves, the surveillance region.

The outputs 21 and 22 of the comparators 17 and 18 lead to a processing circuitry which is not illustrated and which is constructed to provide a counting function based on the above-mentioned lead/lag relationships and may incorporate an up-counter and a separate down-counter of known constructions. This processing circuitry may be of any known construction capable of exploiting the instantaneous lead/lag relationship for incrementing the count of the up-counter only when the output signal of the comparator 17 changes its binary value in advance of that of the comparator 18, and for incrementing the count of the down-counter only when the output signal of the comparator 18 changes its binary value in advance of that of the comparator 17, so that the up-counter and the down-counter respectively separately count the number of entries into and exits from the surveillance region, and thus ideally the number of people who have entered and who have left the surveillance region. However, as disclosed in more detail below, it is possible and contemplated by the present invention, especially when such total separate counts of people entering and leaving the surveillance region are not of interest, to construct the aforementioned processing circuitry in such a manner that the output signals appearing on the outputs 21 and 22 of the comparators 17 and 18 are respectively supplied to the up-counting and the down-counting inputs of a non-illustrated single up-and-down counter of a known construction, in which case the output signal of this single up-and-down counter will ideally directly provide the information about the number of people present at the respective landing at any particular time. In this case, the processing circuitry may be of the type disclosed in FIGS. 8 and 11.

The counts of such counter or counters may also be utilized in a computer, to be disclosed in detail below in connection with FIGS. 13 and 14, which keeps a running total according to time and floor and the stored result can later be used for planning efficient dispatching of the elevators to the respective floors of the building in accordance with typical demand patterns.

It will be appreciated from the above explanation of the operation of the comparators 17 and 18 in FIG. 3 that it is immaterial for counting or detection purposes exactly how much a person entering or leaving the surveillance region adds to or subtracts from the total heat contents of the scene, so long as the amount of added or subtracted heat is sufficient to cause the effective voltage of the positive or negative comparator 17 or 18 surpass the respective reference or threshold voltage −REF or +REF and so long as the entry of a person adds to and the exit of a person subtracts from the total heat contents of the scene. Rather, this heat amount will only slightly influence the timing of the issuance of the changed binary signal of the comparator 17 or 18 but not the lead/lag relationship, except under extreme conditions which will hardly, if ever, be encountered. This has the advantage that the counting operation will not be adversely affected either by the size of, or the character of the outer garments worn by, the particular person entering or leaving the surveillance region, or, in most instances, the weather or heat conditions prevailing outside or within the surveillance region, all of which may influence the total heat output of the particular person.

However, for the same reason, this feature of the detecting arrangement 1 of the present invention has an undesirable consequence when the arrangement 1 is used in applications where a number of people can simultaneously enter and/or leave the surveillance region, in that the arrangement 1 as described so far is incapable of distinguishing between the entry (or exit) of a single person and of two or more people at the same time. To avoid this drawback, it is proposed in accordance with another aspect of the present invention to use a mask 3' shown in FIG. 4 of the drawing in the detecting arrangement 1 instead of the mask 3 illustrated in FIG. 1. The mask 3' has an opening 5' which is bounded by a serrated border 23 consisting of a plurality of individual projections 24 separated from each other by intervening spaces 25. The projections 24 (and hence the spaces 25) are shown to have triangular configurations, but it is contemplated as well to use projections 24 having other configurations, such as trapezoidal, rectangular, part-circular or other, as well as combinations of such configurations. The projections 24 may be provided only at areas of the border 23 corresponding to all or some of the entrances to or exits from the surveillance region, or all around the periphery of the aperture 5'.

Figure 4:
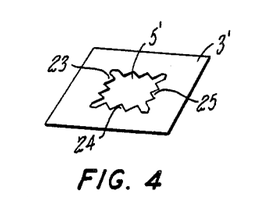
FIG. 4 is a top plan view of a mask which may be used in the optical system of the detecting arrangement of FIG. 1.

The projections 24 prevent radiation from corresponding areas of the surveillance region from reaching the detector 4, so that entry of a person passing into the surveillance region through one of such shielded areas will be detected by the detector 4 at a later time than if that person entered through an unshielded area corresponding to the respective space 25 of the border 23. Thus, if two persons walk into the surveillance region abreast, the entry of one will be detected sooner than that of the other, and both will be counted. Conversely, on leaving the surveillance region, the exit of a person passing through the shielded area will be detected sooner than that of a person leaving through the unshielded area, and once more both of such persons will be counted. This principle can also be extended to three or more people entering or leaving simultaneously.

Despite the above-described precautions, it is still possible that the count provided by the counters or counter may be inaccurate. Therefore, in practical applications, it is desirable to provide a reset for the counters or counter to delete from time to time residual counts caused by inaccuracies of the detector 4 or of its operation. This housekeeping chore can be performed by the main controller or computer, for instance, by comparing call button activity for the respective floor with the counter output. So, for instance, the up-and-down counter could be reset to zero after a predetermined, relatively long period of call button inactivity.

Figure 5:
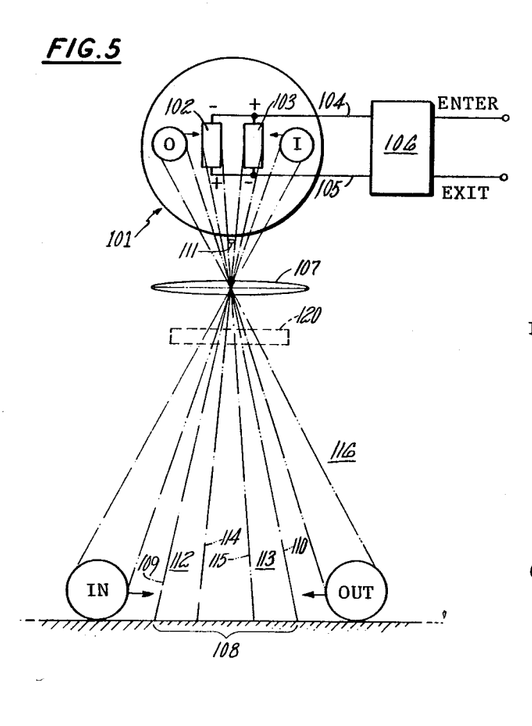
FIG. 5 is an exploded simplified partly bottom plan and partly side elevational view of a pyroelectric detecting arrangement of the present invention and of the environment in which it is being used.

FIG. 5 provides a diagrammatic partly bottom plan view and partly side elevational view of a detector arrangement 101 of the detector arrangement which may be used according to the present invention and shows the environment in which the arrangement 101 may be used and it may be seen that the arrangement 101 includes two detector elements 102 and 103. The detector elements 102 and 103 are interposed with opposite polarities between two output lines 104 and 105 that carry electrical output signals of the arrangement 101. The output lines 104 and 105 lead to an evaluating circuit which is identified in its entirety by the reference numeral 106 and which evaluates the electrical output signals of the arrangement 101, as will be described in detail later. The detector arrangement 101 may be of any known type sensitive to infrared radiation, but preferably is of a pyroelectric type, such as that commercially available from Eltec Instruments Inc. under the designation ELTEC 5192 or ELTEC 442-3.

In the installation of FIG. 5, a lens 107 concentrates electromagnetic radiation, especially that in the infrared range of the spectrum, from a region 108 to be surveilled, especially from a doorway, such as that of an elevator, onto the detector arrangement 101. Rays 109 and 110 indicate the outer boundaries of this surveillance region 108. A mask 111 is shown to be interposed between the lens 107 and the detector arrangement 101. This mask 111 subdivides the surveillance region 108 into two surveillance zones 112 and 113 that are inwardly delimited by rays 114 and 15.

The detector arrangement 101 and the mask 111 are so positioned relative to the surveillance region 108 that a person entering a space 116 through the surveillance region 108, as indicated by a circled IN at the lower part of FIG. 5, will first pass through the zone 112 and then, some time later, through the zone 113. An image of such an entering person, which is correspondingly indicated by a circled I in the upper part of FIG. 5, will thus travel across the detector element 103 first and then, some time later, across the detector element 102. Conversely, a person leaving the controlled-access space 116 through the surveillance region 108, as indicated by a circled OUT at the lower part of FIG. 5, will first pass through the zone 113 and then, some time later, through the zone 112. Hence, an image of such an exiting person, which is correspondingly indicated by a circled 0 in the upper part of FIG. 5, will move across the detector element 102 first and then, some time later, across the detector element 103. As a result, the electrical signal appearing, for instance, on the output line 104 will have the shape indicated in FIG. 6a for a person entering the controlled-access space 116, and that appearing in FIG. 6b for a person exiting from the controlled-access space 116 through the surveillance region 108.

The lens 107, together with a non-illustrated housing supporting the components 102, 103 and 111, also prevents convection heat from reaching the detector elements 102 and 103. It is advantageous when the lens 107 is made of, or is coated with, a material which prevents radiation outside the spectral range of interest from reaching the detector elements 102 and 1033, so that such unwanted radiation will not adversely affect the accuracy of measurement of the detector arrangement 10!. The lens 107 has a relatively short focal length so as to concentrate the radiation from the surveillance region 108 within a relatively short distance onto active areas of the detector elements 102 and 103.

The mask 111, which is shown to be interposed between the lens 107 and the detector elements 102 and 103, may be situated instead at any other location, such as in front of the lens 107 as considered in the direction of propagation of the radiation to be detected from the region 108 under surveillance to the detector elements 102 and 103, or constitute a part of the lens 107 or of the detector arrangement 101 by being directly applied or connected thereto, and it may additionally also determine the outer boundary of the region 108 under surveillance by masking out radiation from around the surveillance region 108. Obviously, the mask 111 is so situated relative to the detector elements 102 and 103 and to the lens 107 and has such properties that it permits the radiation of interest from the respective zones 112 and 113 of the surveillance region 108 to reach the active areas of the associated detector elements 102 and 103, while simultaneously preventing all such radiation of interest and other radiation stemming from regions external to the respective surveillance zones 112 and 113 from propagating toward the active areas of the detector elements 102 and 103. Under some circumstances, the mask 111 may be omitted altogether, or replaced by a mask determining the outer boundaries of the surveillance region 108 but not masking the intervening zone situated between the surveillance zones 112 and 113.

Figures 6A, 6B, 7:
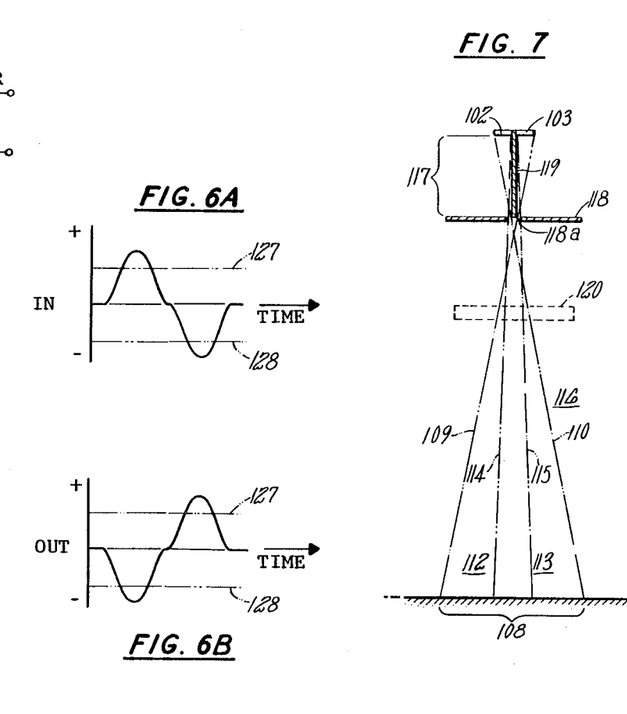
FIGS. 6a and 6b are diagrammatic representations of the changes in an analog electrical signal generated in the detecting arrangement of FIG. 5 in response to entry of a person into a surveillance region and to departure of a person from the surveillance region, respectively.
FIG. 7 is a view similar to FIG. 5 but of a modified construction of the detecting arrangement.

An alternative construction, which achieves the same results as described above but is less expensive than that of FIG. 5 since it eliminates the lens 107, is shown in FIG. 7 of the drawing where the same reference numerals as used previously in FIG. 5 have been used to identify corresponding elements. This construction utilizes a mask arrangement 117 that includes a transverse mask 118 having an aperture 118a, and a partitioning wall 119 extending from the aperture 118a to the detector elements 102 and 103 at right angles to the transverse mask 118. The aperture 118a advantageously has a very small width and provides sharp boundaries for the surveillance zones 112 and 113.

In this arrangement, and also in that of FIG. 5 especially if the lens 107 does not act as a filter that prevents passage of the radiation outside the desired range of the spectrum therethrough, it is proposed to interpose a filtering plate 120 into the path of the radiation between the surveillance region 108 and the detector elements 102 and 103, particularly when the pyroelectric detector arrangement 101 as supplied by the manufacturer does not already incorporate a filter window which performs this filtering function.

As shown in FIG. 6a of the drawing, the pyroelectric detector arrangement 101 of the above type generates an electrical signal which first has a positive excursion from its initial value, followed by return to the initial value, a negative excursion, and final return to the initial value when a person enters the controlled-access space 116 through the surveillance region 108, temporarily adding thermal energy to the scene in the zones 112 and 113, in that succession. On the other hand, as indicated in FIG. 6b, when a person leaves the controlled-access space 116 through the surveillance region 108, with attendant temporary increase in the thermal energy emanating from the surveillance zones 113 and 112, in that succession, the electrical signal issued by the pyroelectric detector arrangement 101 first exhibits a negative excursion from its initial value, followed by return to the initial value, a positive excursion, and final return to the initial value. Thus, the sequence in which the negative and positive excursions occur indicates whether a person has entered or left the controlled-access space 116 through the surveillance region 108. The pyroelectric detector elements 102 and 103 differentiate (with respect to time) the total optical power striking their respective active areas, with only changes in the level of the optical power producing an output. This, of course, presupposes that the combined effect of the emissivity and the temperature of the person adds energy to the scene, but it would be rare indeed that this condition would not be satisfied.

The thus modulated electrical signal then appears for instance at the output lead 104 of the detector arrangement 101, while the other output lead 105 of the detector arrangement 101 is connected to the ground. This modulated electrical signal is then evaluated by the evaluating circuit 106 which may have the construction illustrated in FIG. 8 of the drawing.

Figures 8, 9:
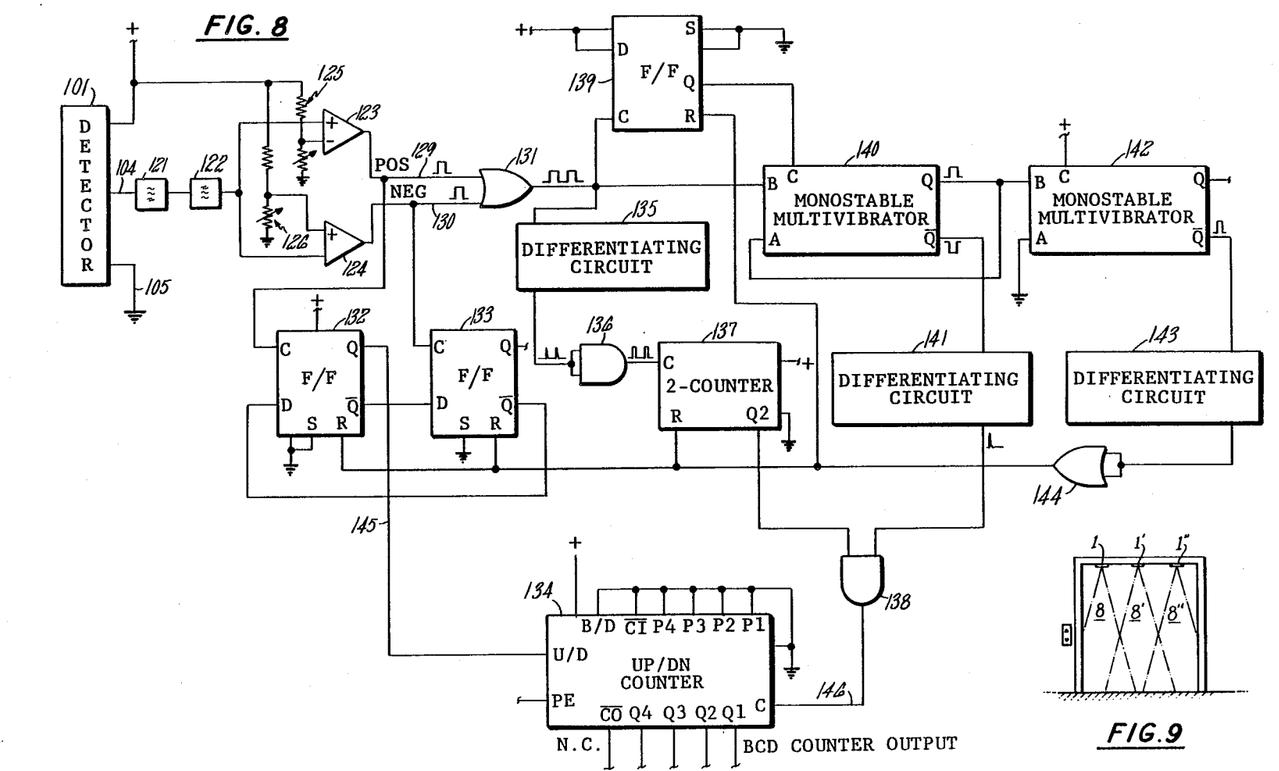
FIG. 8 is a circuit diagram depicting an evaluation circuitry which may be used for evaluating the signals received from the detecting arrangement of FIG. 5.
FIG. 9 is a front elevational view of an entryway illustrating the disposition of a detecting system including three of the detecting arrangements of FIG. 5 relative to the entryway.

As shown there, the output lead 104 of the detector arrangement 101 is connected to the input of a high-pass filter 121 whose output is connected to the input of a low-pass filter 122. The filters 121 and 122 together constitute a bandpass filter which filters out undesired frequencies from the electrical signal issued by the detector arrangement 101, presenting a filtered electrical signal at its output. This output is then connected to the positive input of a comparator 123 and to the negative input of a comparator 124. The negative input of the comparator 123 is supplied with a reference or threshold voltage from an adjustable voltage divider 125, while a reference voltage from another adjustable voltage divider 126 is supplied to the positive input of the comparator 124. The threshold voltages are selected in the manner indicated in FIGS. 6a and 6b by the lines 127 and 128, so that the comparator 123 will issue a high signal only when the output signal of the low-pass filter 122 exceeds the reference voltage 127 and a low signal at all other times, while the output signal of the comparator 124 will have a high value only when the output signal of the low-pass filter 122 drops below the reference voltage 128 and a low value at all other times.

It will be appreciated from the above explanation of the operation of the detector arrangement 101 that it is immaterial for counting or detection purposes exactly how much a person entering or leaving the surveillance region 108 adds to the total heat contents of the scene, so long as the amount of the added heat is sufficient to cause the effective voltage reaching the respective comparators 123 and 124 to surpass the respective reference or threshold voltage levels 127 or 128. Rather, this heat amount will only influence the timing of the issuance of the changed binary signal by the comparators 123 and 124. This has the advantage that the counting operation will not be adversely affected either by the size of, or the character of the outer garments worn by, the particular person entering or leaving the surveillance region, or in most instances by the weather or heat conditions prevailing outside or within the surveillance region 108, all of which may influence the total heat output of the particular person.

Inasmuch as the output signal of the filter 123 has both a negative and a positive excursion during each passage of a person through the surveillance region 108, each comparator 123 and 124 will issue a high signal during each such passage. However, as may be ascertained from FIGS. 6a and 6b, these high signals will be in one lead/lag relationship for a person entering the controlled-access space 116, and in the reverse lead/lag relationship for a person leaving the space 116.

In the construction illustrated in FIG. 8 of the drawing, the output signals of the comparators 123 and 124, which are respectively identified as POS and NEG, are supplied by respective electrical connections 129 and 130 to the inputs of an OR-gate 131. Consequently, two binary "1" signals will appear in close succession at the output of the OR-gate 131 upon each passage of a person through the surveillance region 108, regardless of the direction of travel.

The POS signal is also supplied to a clock input C of a first flip-flop 132, whereas the NEG signal is also supplied to a clock input C of a second flip-flop 133. The Q output of the first flip-flop 132 is connected to an up/down input U/D of an up-and-down counter 134. The Q output of the first flip-flop 132 is connected to the data input D of the second flip-flop 133, and the Q output of the second flip-flop 133 is connected to the data input D of the first flip-flop 132. As a result, when the POS signal leads the NEG signal with the flip-flops 132 and 133 in their reset states, the binary "1" signal at the Q output of the second flip-flop 133 will appear at the D input of the first flip-flop 132 at the time of change in the POS signal to the binary "1" value and thus will be supplied to the U/D input of the counter 134, incrementing its count by one when the next clock signal arrives to a clock input C of the counter 134. Then, by the time the NEG signal changes its value to binary "1", the POS signal value has already changed back to binary "0", so that the first flip-flop 132 is not being clocked and the output signal appearing at its Q output thus does not change. Conversely, when the POS signal lags the NEG signal with the flip-flops 132 and 133 again in their reset states, the binary "1" signal at the Q output of the first flip-flop 132 will appear at the D input of the second flip-flop 133 at the time of change in the NEG signal to the binary "1" value and thus a binary "0" value will appear at the Q output of the second flip-flop 133 and thus at the D input of the first flip-flop 132. Then, at the time the POS signal changes its value to binary "1", this binary "0" value will propagate to the Q output of the first flip-flop 132 and from there to the U/D input of the counter 134, decrementing its count by one at the time of arrival of the next following clock pulse to the C input of the counter 134. Thus, it may be seen that the count of the counter 134 will be increased each time the binary "1" in the POS signal precedes that in the NEG signal, and decreased each time the binary "1" in the NEG signal precedes that in the POS signal, in each instance at the time of arrival of the next clock pulse to its C input.

The output of the OR-gate 131 is connected to the input of a differentiating circuit 135 of a known construction which converts each of the two square-wave signals issued by the OR-gate 131 into a spike-shaped pulse. The succession of these two pulses is then supplied to the two inputs of an AND-gate 136 which converts these pulses in a well-known manner into short-duration square-wave signals. These signals are then supplied to a counting input of a counter 137 that has a Q2 output that issues a binary "1" signal after counting to two. This output signal is then supplied to one input of another AND-gate 138 to enable the latter. It may be seen that the gate 138 will be enabled only when the counter 137 has counted two incoming signals before being reset. As will be explained below, this means that the gate 138 will be enabled only when the two signals being counted by the counter 137 are so close to one another in time that the likelihood that they could be generated in any other manner than by a person passing through the surveillance region 108 is negligible, if at all present. In this manner, it is assured that two spurious signals resulting from causes other than the passage of a person through the surveillance region 108 will be prevented from incrementing or decrementing the count of the counter 134.

The succession of the two output pulses of the OR-gate 131 is also supplied to the clock input C of another flip-flop 139 that issues a binary "1" signal at its Q output in response to the first one of the signals of this succession and does not change its state until reset, and to an input B of a monostable multivibrator 140 having a relatively large time constant. The Q output and the A input of the monostable multivibrator 140 are connected with one another to prevent retriggering of the monostable multivibrator 140 during its timing period. The Q output of the flip-flop 139 is connected to the clock input C of the monostable multivibrator 140 which thus commences its operation when the signal on its C input is high and the signal on its B input changes to low, and continues to operate for the duration of its time constant. This means that a binary "1" signal appears on the Q output and a binary "0" signal appears at the Q output of the monostable multivibrator 140 for the duration of its timing period.

The Q output of the monostable multivibrator 140 is connected to the input of another differentiating circuit 141 which issues a spike-shaped output pulse when the signal supplied thereto from the Q output of the monostable multivibrator changes its value from binary "0" to binary "1", that is, at the end of the operation of the monostable multivibrator 140. The output pulse of the differentiating circuit 141 is then supplied to the other input of the AND-gate 138 and passes therethrough if the gate 138 has been previously enabled by the signal from the Q2 output of the counter 137. The output of the gate 138 is connected to the clock input of the up-and-down counter 134, thus enabling the count of the latter to be incremented or decremented by the signal appearing at its U/D input.

The Q output of the monostable multivibrator 140 is also connected to the B input of another monostable multivibrator 142 having a relatively small time constant, whose clock input C is permanently held at a high level and whose A input is held permanently at a low level. This monostable multivibrator 142 responds to the change in the value of the signal supplied to its B input from high to low by issuing a square-wave output signal at its Q output. This signal is then converted by still another differentiating circuit 143 into a spike-shaped pulse which is supplied to the two inputs of another OR-gate 144 the output of which is connected to the resetting inputs R of the three flip-flops 132, 133 and 139 and of the counter 137. Thus, these components will be reset after each succession of two signals arriving on the lines 129 and 130.

It will be easily understood that, because of the use of a single up-and-down counter 134, the signals appearing at the Q1, Q2, Q3 and Q4 outputs of this counter 134 are representative of the number of people present in the controlled-access space 116 at any given time. However, two separate counters, one for the up count and the other for the down count, could be used instead if it was desired to collect information about the number of people who have entered and who have left the controlled-access space 116 during a given time period, and these separate counts could then be combined, if so desired. If the surveillance region were selected to be a doorway or other entryway to an elevator landing area, the running total obtained from the up-and-down counter 134, or the combined running total or the separate counts of the two separate counters, could be used for efficiently dispatching the elevators to the respective floors in accordance with demand. The counts of the individual counters would then also provide information as to the total number of people who have passed through the respective surveillance region in either direction during a given period of time, and thus the number of people who have used the elevators to travel to and from the particular floor, especially when the arrangement 101 is installed at the elevator doorway. In each of these cases, the signals appearing at an output line 145 from the Q output of the first flip-flop 132 and at an output line 146 from the OR-gate 138 are being used to operate the counter or counters if such discrete counter or counters are provided. Yet, such signals may just as well be supplied to a computer, such as that used for controlling the operation of the elevators, for evaluation, use and/or display.

The detecting arrangement of the present invention as described so far performs well, especially when the width of the surveillance region 108 is such that only one person can pass through at any given time. However, this condition is often not satisfied, that is, the doorway or other entryway and thus the area to be surveilled for the passage of people therethrough is wide enough to permit two people to pass therethrough at the same time either in the same direction or in opposite directions. To provide reliable counting even under these circumstances, it is contemplated by the present invention, as indicated in FIG. 9 of the drawing, to arrange three detector arrangements 1,1′ and 1″ above the doorway. The field of view or surveillance region 8′ of the central detector arrangement 1′ partially overlaps the vision field or surveillance region 8 and 8″ of the lateral detector arrangements 1 and 1″, respectively. It is to be noted in this context that, instead of using only two detector arrangements, as would be expected for a doorway that is only wide enough to let two people through at any given time, three such detecting arrangements are being used in accordance with the present invention.

Figures 10, 11:
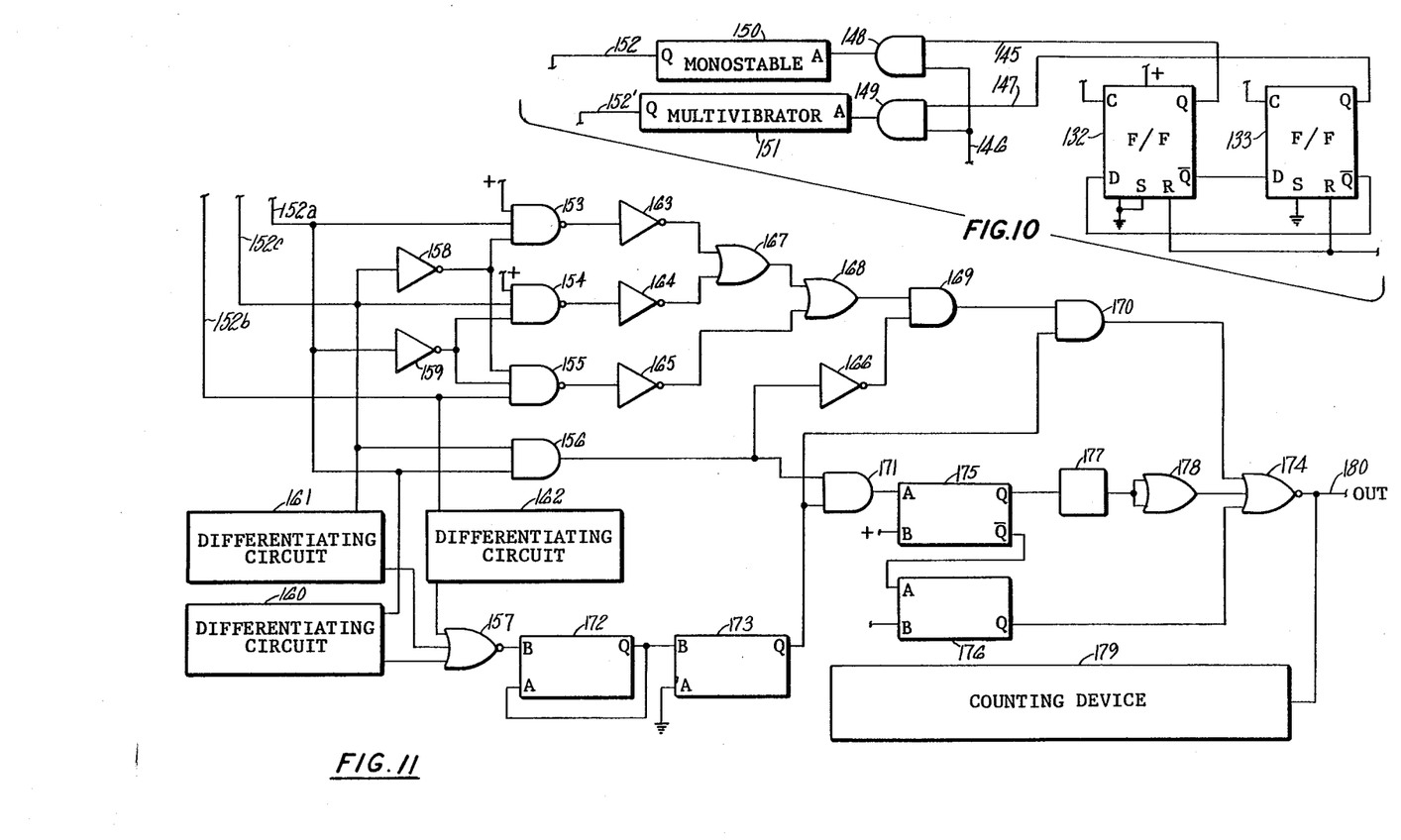
FIG. 10 is a circuit diagram of an output portion of the evaluation circuitry of FIG. 8 as modified for use with the detecting system of FIG. 9.
FIG. 11 is a diagrammatic representation of a combination and counting circuitry which may be used with the detecting system of FIG. 9 and with the evaluation circuitry of FIG. 8 as modified in FIG. 10.

The detector arrangements 1′ and 1″ are constructed in the same manner as disclosed above for the detector arrangement 101, and each of them has associated therewith an evaluating circuitry that is basically the same as the evaluating circuitry 106 explained above in conjunction with FIG. 8 of the drawing, except as noted below with reference to FIG. 10 of the drawing which illustrates only that portion of the evaluating circuitry 106 which differs from the above-discussed single-detector version.

In this expanded version of the detector system, the output line 145 (from the Q output of the first flip-flop 132) is connected to one input of a first discriminating AND-gate 148, while another output line 147 connects the Q output of the second flip-flop 133 with one input of a second discriminating AND-gate 149. The output line 146 (from the AND-gate 138) is connected to another input of each of the discriminating AND-gates 148 and 149. The outputs of the gates 148 and 149 are connected to the A inputs of respective monostable multivibrators 150 and 151, respectively. The monostable multivibrator 150 issues an ENTER signal on its Q output to an output line 152 when a person entered, and the monostable multivibrator 150 issues an EXIT signal on its Q output to an output line 152′ when a person leaves, the controlled-access space 116 through the surveillance region 8, 8′ or 8″ of the respective detector arrangement 1, 1′ or 1″.

These signals issued by one of the evaluating circuits 106 are then supplied to two identical combination and counting circuits, one for the ENTER signals and the other for the EXIT signals, together with the corresponding signals from the two remaining evaluating circuits 106. Inasmuch as these two combination and counting circuits have the same constructions and operate in the same manner, only that for the ENTER signals will be described below with reference to FIG. 11 of the drawing. Herein, the reference numerals 152a, 152b and 152c have been used to identify the lines carrying the ENTER signals from the multivibrators 150 associated with the detector arrangements 1, 1′ and 1″, respectively.

The ENTER signal on the line 152a is supplied directly to an input of a NAND-gate 153 and to an input of an AND-gate 156, through an inverter 159 to an input of each of NAND-gates 154 and 155, and through a differentiating circuit 160 to an input of a NOR-gate 157. The ENTER signal on the line 152c is supplied directly to an input of the NAND-gate 154 and to another input of the AND-gate 156, through an inverter 158 to an input of each of the NAND-gates 153 and 155, and through a differentiating circuit 161 to an input of the NOR-gate 157. The ENTER signal on the line 152b is supplied directly to an input of the NAND-gate 155 and through a differentiating circuit 162 to an input of the NOR-gate 157. The outputs of the gates 153 and 154 are connected, through respective inverters 163 and 164, to respective inputs of an OR-gate 167 whose output is coupled to one input of another OR-gate 168. The output of the NAND-gate 155 is connected through an inverter 165 to another input of the OR-gate 168, while the output of the AND-gate 156 is connected through an inverter 166 to an input of another AND-gate 169, whose other input is coupled to the output of the OR-gate 168. The output of the gate 169 is connected to one input of a further AND-gate 170, while the output of the gate 156 is also connected to one input of still another AND-gate 171.

The output of the NAND-gate 157 is connected to the B input of a monostable multivibrator 172 whose Q output is connected with its A input to prevent retriggering of the monostable multivibrator 172 during its timing period, and also with the B input of another monostable multivibrator 173 whose A input is connected to the ground. The output signal appearing at the Q output of the monostable multivibrator 173 is supplied to another input of each of the gates 170 and 171.

The output of the AND-gate 170 is directly connected to one input of a NOR-gate 174. The output of the AND-gate 171 is connected to the A input of a monostable multivibrator 175 whose B input is being permanently held at a high level and whose not Q output is connected to the A input of another monostable multivibrator 176 whose B input is also being permanently held at a high level. The Q output of the monostable multivibrator 176 is directly connected to another input of the NOR-gate 174, while the Q output of the monostable multivibrator !75 is connected with still another input of the NOR-gate 174 through a series connection of a differentiating circuit 177 and an OR-gate 178.

Because of this construction, a single output signal indicative of entry of a person will appear at the output of the NOR-gate 174 either when entry is detected through the surveillance region 108 (of FIG. 9) but not through the surveillance region 8″, or when entry is detected through the surveillance region 8″ but not through the surveillance region 8, or when entry is detected through the surveillance region 8′ but not through either one of the surveillance regions 8 and 8″. On the other hand, two such signals will appear at the output of the NOR-gate 174 when entry is detected simultaneously through both of the surveillance regions 8 and 8″. Each such output signal is then supplied to the input of a counting device 179 of a conventional construction which thus keeps a running total of the number of people who have actually entered the controlled-access space 116 through the respective entryway since the commencement of the counting operation of the counting device 179. Obviously, the counting device 179 may be reset from time to time or as desired to recommence its counting operation.

It will be readily understood that the other combination and counting circuit will provide a separate running total of the number of people who have left the controlled-access space through the same entryway. This other combination and counting circuit operates in the same manner as described above but on the basis of the EXIT signals appearing at the output lines 152 of the respective evaluating circuits 106 associated with the arrangements 1, 1′ and 1″. These separate running totals may then be combined, if so desired, to obtain the actual number of people present in the controlled-access area 116 at any given time. This may be accomplished, for instance, by supplying the output signals of the gates 174 of the two combination and counting circuits through respective output lines 180 to an up-and-down counter arrangement of a known construction, or to a computer. Moreover, the signals on the output lines 180 may also be used for additional purposes. For example, when the entryway is the doorway of an elevator, such signals may be used to keep a score of the traffic flow through the building on the basis of the number of people entering and leaving the elevator at the respective floors.

Despite the above-described precautions, it is still possible, albeit highly unlikely, that the count provided by the counters or counter may be inaccurate. Therefore, in practical applications, it is desirable to provide a reset for the counters or counter to delete from time to time residual counts caused by inaccuracies of the detector arrangements 1, 1′ and/or 1″ or of their operation. This housekeeping chore can be performed by the main controller or computer, for instance, in elevator applications, by comparing destination floor button activity for the respective floors with the counter output. So, for instance, the up-and-down counter could be reset to zero after a predetermined, relatively long period of destination floor button inactivity.

Figure 12:
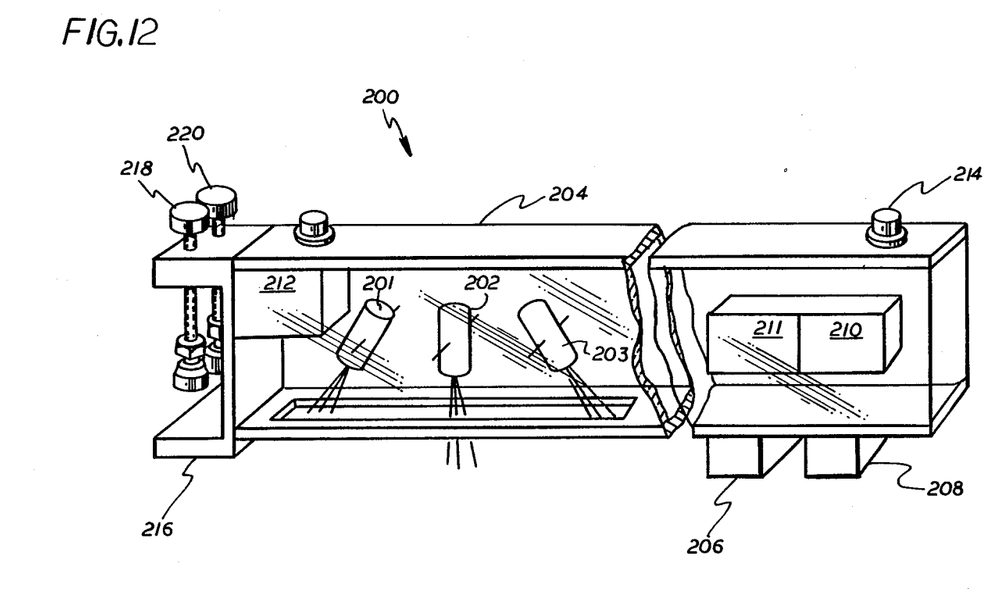
FIG. 12 is a simplified illustration of a portable elevator traffic pattern monitor, according to the present invention.

FIG. 12 is a simplified illustration of a portable elevator traffic pattern monitor 200, according to the present invention. A directional people counter may comprise a passive device such as previously described which may use an array of three dual-element infrared detectors 201, 202, 203 mounted within an enclosure 204 which may be mounted on the elevator car above the door to determine the number and direction of people passing. Three detectors are used in this embodiment in order to count two people entering and/or exiting simultaneously, as previously described. The detectors, which may be responsive to e.g., 8-12 micron wavelength thermal radiation emitted by the human body, each may contain two pyroelectric elements connected in parallel with opposing polarities, as previously described. Of course, it should be understood that other types of sensors may be used and the claimed invention is not restricted to the specific sensors described.

An infrared door open sensor 206 is utilized to sense that the car door is open. It may be an emitter/reflector photoelectric switch which consists of a modulated LED light source, phototransistor an LED alignment indicator, and a demodulator circuit. Such devices are standard reflective photoelectric switches and are available from a number of different manufacturers. One such device is made by Efector having a part number 01 5005. This particular item is optional. Of course, it should be understood that if used it need not be a "door open" sensor but may in general be a door position sensor.

An infrared ground floor sensor 208 may be utilized to sense when the car is at the ground floor. The ground floor sensor may be similar to the door open sensor 206, e.g., an Efector 01 5002. This item is also optional.

An electronic altimeter 210 may be utilized to indicate the current car height from which the current floor can be determined. The electronic altimeter may be a microprocessor based barometer which converts barometric readings into altitude data. Such is available from Atmospheric Instrumentation Research, Inc., under the brand name "Intellisensor" under part number AIR-DB-1A. Other types of height sensors are of course unable and are contemplated to be within the scope of the claimed height sensing means.

A microprocessor based data logger 211 with a real time clock and RS-232C serial data link may be used to log the number of people entering and exiting an elevator car according to time and floor during the period when activated.

A battery 212 provides the necessary power for powering the portable monitor 200 during the selected period of monitoring. It may be set up to be a replaceable dry cell or may be rechargeable, as desired. This is not to say, of course, that one could not use an external power supply such as an AC hook-up from the elevator itself. However, it will be understood that the portability and independence of the monitor will be enhanced by use of a battery.

The package 200 may be located inside the car on top of the door frame. A separate personal computer may be hooked up to a connector 214 in order to either initialize the portable monitor prior to installation or to extract data after a selected period of monitoring. If more than one monitor is installed in a building at a given time, traffic data may be compiled from all of the cars in a group in order, for example, to enable the making of a new group strategy.

A bracket 216 is shown attached at one end of the monitor 200 having a pair of clamps 218, 220 with which to temporarily attach the monitor 200 to the elevator car. A similar bracket, though not shown, would be attached to the other end of the monitor 200.

Figure 13:
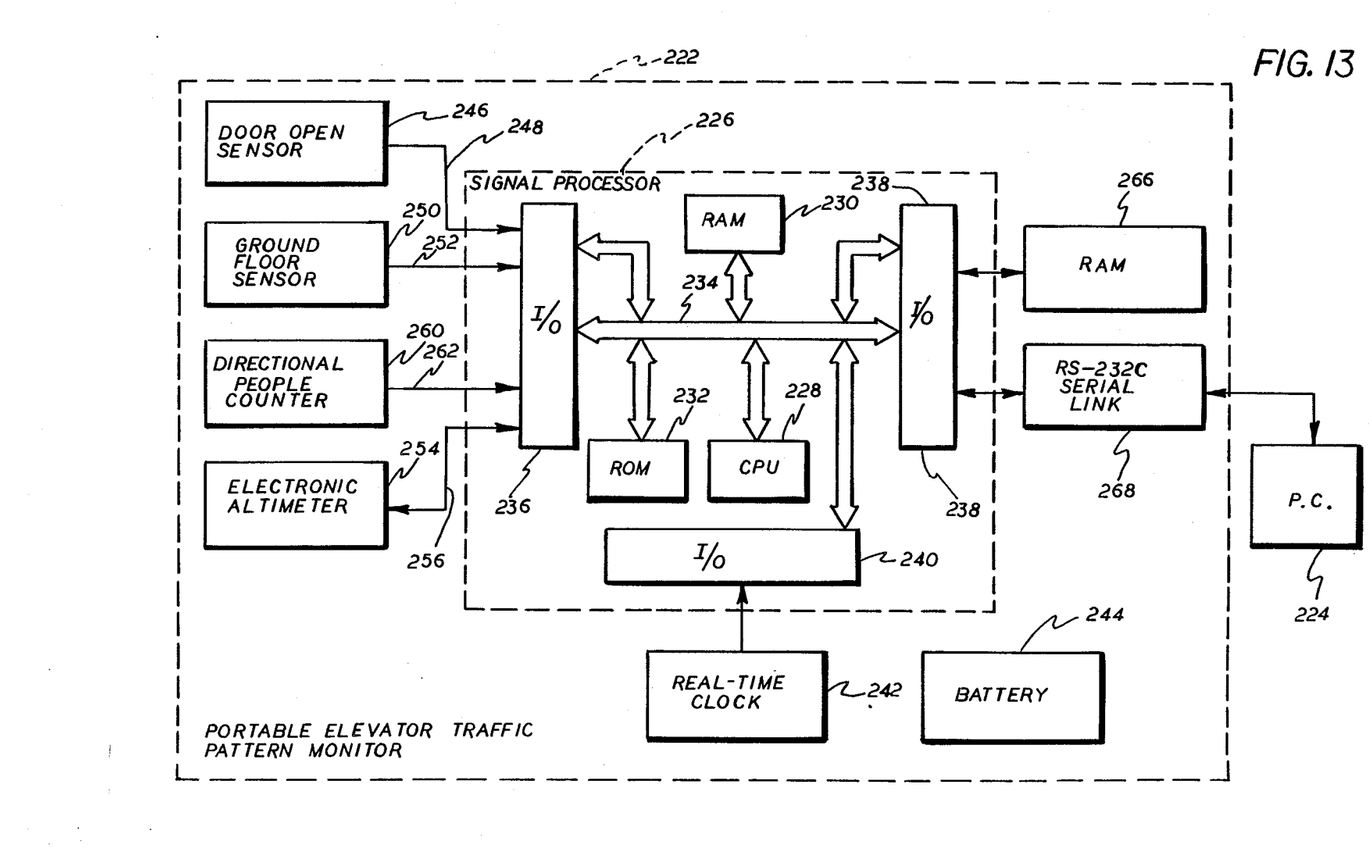
FIG. 13 is a simplified block diagram illustration of components which may comprise a portable elevator traffic pattern monitoring system.

FIG. 13 is a simplified block diagram illustration of a portable elevator traffic pattern monitor 222 similar to that shown in FIG. 12 and which may interface with a personal computer 224 for the purposes of initialization and extraction of data.

A signal processor 226 comprises a central processing unit 228, a random access memory (RAM) 230 and a read only memory (ROM) 232 which are all interconnected by means of a control, data and address bus 234 which also is connected to a number of input/output (I/O) devices 236, 238, 240. The signal processor 226 may be responsive to a real time clock 242 for determining the time of day for purposes of recordal. A battery 244 may be used to power the signal processor 226 and any of the other devices within the monitor 222 which require DC power.

An optional door open sensor 246 provides a signal on a line 248 to the signal processor 226 whenever the elevator car door is sensed as being open. Such a door position sensor is used to activate the data logging function whenever people are able to pass through the car door. It will be understood that although desirable such a component is not essential for carrying out the invention. A similarly optional ground floor sensor 250 provides a signal on a line 252 to signal processor 226 upon sensing the elevator car at the ground floor of the building in which it is installed. This permits the signal processor to zero the floor count as a check against an electronic altimeter 254 which provides a signal on a line 256 to the signal processor 226 indicative of the altitude and hence the floor at which the car is located in the building. It will be noted that the signal on line 256 is bidirectional so that the altimeter may be zeroed upon reception of the signal on line 252. The ground floor sensor 250 and electronic altimeter 254 are used in conjunction with one another for the particular embodiment shown in FIG. 13 but are not limiting to the claimed invention as numerous other means of sensing elevator height with respect to the various floors within a building are contemplated for coverage of the present invention.

The directional people counter 260 provides a signal on a line 262 indicative of a number of people entering and exiting the elevator car and their direction of movement.

The signal processor 226 may utilize an external random access memory (RAM) 266 to store the number of people counted at a particular floor, at a particular time, throughout the selected monitoring period. A serial data line 268 may be established between the signal processor 226 and an external port for the purpose of enabling the hook-up of, for example, the personal computer 224 which may be used for initialization or extracting data from the RAM 266.

Figure 14:
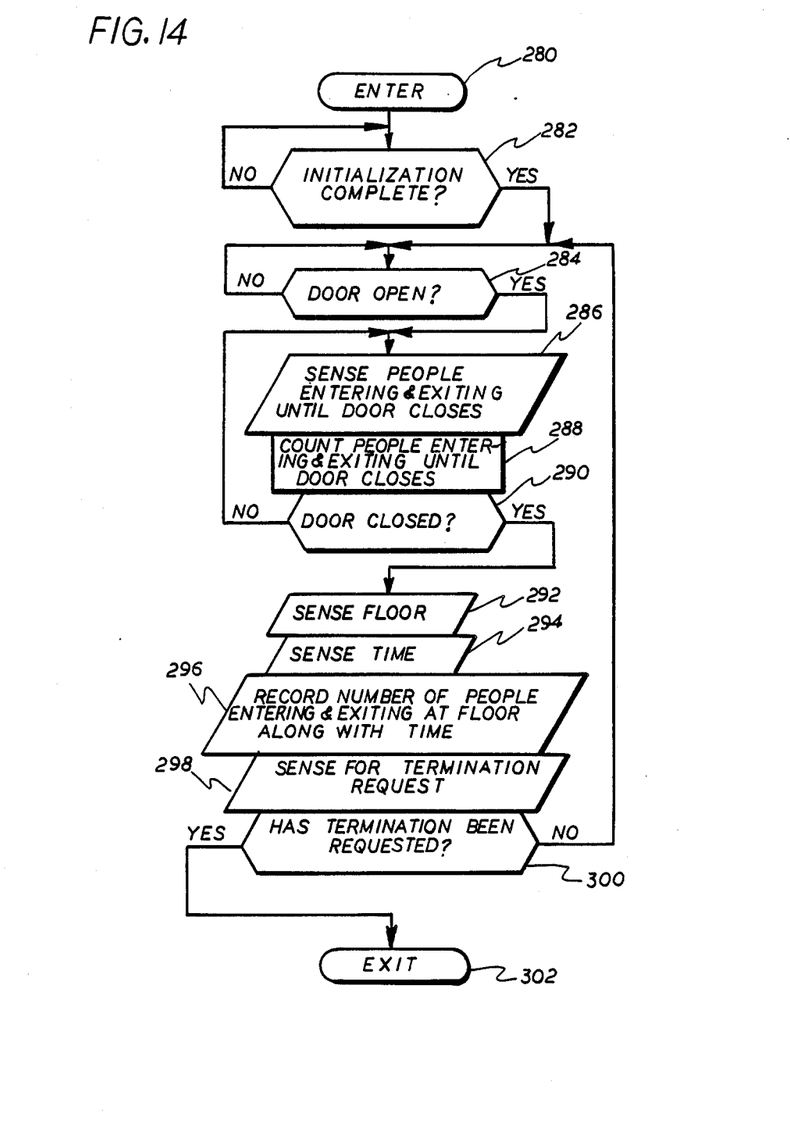
FIG. 14 is a simplified flowchart illustration of a series of steps which may be carried out by the signal processor of FIG. 13 in recording the number of people entering and exiting at various floors during the course of a selected period of time.

FIG. 14 is a simplified flowchart illustration of a series of steps which may be executed, for example, by the signal processor 226 of FIG. 13 in carrying out the people counting and recording functions taught herein.

After entering at a step 280, a decision is made in a step 282 as to whether or not initialization is complete. Such a step would be repeated until an affirmative answer is obtained. This will correspond to the personal computer 224 of FIG. 13 being hooked up to the monitor 222 in order to provide initialization sequences to start-up the signal processor and provide the proper zeroing and counting functions.

Assuming initialization has been determined to be completed, a step 284 is next executed in which a determination is made as to whether or not the elevator car door is open or not. If not, the step 284 is repeatedly executed until it is determined that the elevator car door is in fact open. This is determined by a door open sensor such as the sensor 246 of FIG. 13. Upon determining that the door is in fact open, a step 286 is next executed in which the number of people entering and exiting the elevator car is sensed until the door closes. This may also be sensed by the door open sensor. I.e., if the door is not sensed open it may be assumed to be closed. Of course, there could be a separate door close sensor.

During the period in which the car door is sensed open, the number of people entering and exiting is counted as indicated in a step 288. A step 290 indicates that as long as the door is open the steps 286, 288 will continue to be re-executed so that the total number of people entering and exiting may be counted.

As soon as the door closes, the floor at which the car is located is sensed as indicated in a step 292. This may be accomplished by means of an electronic altimeter 254 such as is shown in FIG. 13. At this time also the time may be sensed as indicated in a step 294. A real time clock 242 such as is indicated in FIG. 13 may be used for this purpose. The number of people entering and exiting at the particular floor along with the time is recorded as indicated in a step 296. This may be recorded in a RAM 266 such as is shown in FIG. 13.

A step 298 is next executed in which it is determined whether or not a termination request has been made. This may be done, for example at the end of the day, by hooking up the personal computer 224 of FIG. 13 to the serial link 268 and indicating to the signal processor 226 that the test should be terminated. If it is determined in a step 300 that such a termination request has been made an exit may be made as indicated in a step 302 and the information extracted from the RAM 266 by the personal computer 224. If it is determined in step 300 that no such termination request has been made, the steps 284-300 are re-executed until such a request is made.

It will of course be understood that the steps of FIG. 14 merely represent one sequence which may be used to carry out the teachings of the present invention and that many other similar sequences may be used with equal efficacy to carry out these teachings.

Although the invention has been shown and described with respect to a best mode embodiment thereof, it should be understood by those skilled in the art that the foregoing and various other changes, omissions, and additions in the form and detail thereof maybe made therein without departing from the spirit and scope of the invention.

I claim:

1. Apparatus for an elevator, comprising:
   a portable housing for mounting therein a plurality of components, said plurality comprising:
   person sensing means, responsive to the presence of a person, for providing a person signal indicative of a direction of movement of said person;
   height sensing means, responsive to the altitude of said portable housing for providing a floor signal;
   clock means for providing a time signal indicative of the time of day; and
   signal processing means, responsive to said person signal, said floor signal and said time signal for storing said person, floor and time signals.

2. The apparatus of claim 1, wherein said plurality further comprises a battery for providing power for said signal processing means.

3. The apparatus of claim 1, wherein said plurality further comprises a door open sensor, responsive to the position of the elevator car door, for providing a door signal indicative of said position and wherein said signal processing means is responsive to said door signal for carrying out said storing in response to said door signal.

4. The apparatus of claim 1, wherein said plurality further comprises a ground floor sensor, responsive to a selected position of the elevator car, for providing a ground floor signal and wherein said signal processing means is responsive to said ground floor signal for providing a zeroing signal and wherein said height sensing means is responsive to said zeroing signal for providing said floor signal having a magnitude indicative of said selected position.

* * * * *